(12) United States Patent
Lee et al.

(10) Patent No.: US 8,379,476 B2
(45) Date of Patent: Feb. 19, 2013

(54) SEMICONDUCTOR MEMORY DEVICE FOR REDUCING RIPPLE NOISE OF BACK-BIAS VOLTAGE AND METHOD OF DRIVING SEMICONDUCTOR MEMORY DEVICE

(75) Inventors: Beom-seop Lee, Hwaseong-si (KR); Young-hyun Jun, Seoul (KR); Sang-joon Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 137 days.

(21) Appl. No.: 12/984,342

(22) Filed: Jan. 4, 2011

(65) Prior Publication Data

US 2011/0176375 A1    Jul. 21, 2011

(30) Foreign Application Priority Data

Jan. 18, 2010    (KR) .................. 10-2010-0004482

(51) Int. Cl.
 G11C 8/00    (2006.01)
 G11C 5/14    (2006.01)
 G11C 7/00    (2006.01)
(52) U.S. Cl. .............. 365/230.06; 365/189.09; 365/194
(58) Field of Classification Search .............. 365/230.06
 See application file for complete search history.

(56) References Cited

U.S. PATENT DOCUMENTS

| | | | |
|---|---|---|---|
| 6,337,831 B1 * | 1/2002 | Nam | 365/230.06 |
| 6,438,052 B1 | 8/2002 | Sekine | |
| 6,545,923 B2 * | 4/2003 | Sim et al. | 365/204 |
| 6,657,915 B2 * | 12/2003 | Seo et al. | 365/230.06 |
| 7,177,226 B2 * | 2/2007 | Lee | 365/230.06 |
| 7,248,535 B2 * | 7/2007 | Chun | 365/230.03 |
| 7,274,584 B2 * | 9/2007 | Jung et al. | 365/63 |
| 7,639,555 B1 * | 12/2009 | Kim | 365/201 |
| 7,800,961 B2 * | 9/2010 | Son et al. | 365/189.09 |
| 7,852,703 B2 * | 12/2010 | Jang et al. | 365/230.06 |
| 7,920,429 B2 * | 4/2011 | Chi et al. | 365/185.23 |
| 8,050,071 B2 * | 11/2011 | Yu et al. | 365/51 |
| 2007/0008807 A1 * | 1/2007 | Jeong | 365/230.06 |

FOREIGN PATENT DOCUMENTS

| | | |
|---|---|---|
| KR | 1998-087084 | 12/1998 |
| KR | 2002-0078992 | 10/2002 |
| KR | 10-2004-0022090 | 3/2004 |

* cited by examiner

*Primary Examiner* — Son Mai
(74) *Attorney, Agent, or Firm* — Onello & Mello, LLP

(57) ABSTRACT

A semiconductor memory device for reducing ripple noise of a back-bias voltage, and a method of driving the semiconductor memory device include a word line driving circuit and a delay logic circuit. The word line driving circuit enables a sub-word line connected to a selected memory cell to a first voltage, and disables the sub-word line of a non-selected memory cell to a second voltage and a third voltage, in response to a sub-word line enable signal, a first word line driving signal, and a second word line driving signal. The delay logic circuit controls the semiconductor memory device so that an amount of charge of the sub-word line that is introduced to the third voltage is greater than an amount of charge of the sub-word line that is introduced to the second voltage by changing a transition point of time of the sub-word line enable signal with respect to a transition point of time of the first word line driving signal, during the disabling of the sub-word line.

12 Claims, 13 Drawing Sheets

SEMICONDUCTOR MEMORY DEVICE FOR REDUCING RIPPLE NOISE OF BACK-BIAS VOLTAGE AND METHOD OF DRIVING SEMICONDUCTOR MEMORY DEVICE

CROSS-REFERENCE TO RELATED APPLICATIONS

This application claims the benefit of Korean Patent Application No. 10-2010-0004482, filed on Jan. 18, 2010, in the Korean Intellectual Property Office, the entire contents of which are incorporated herein by reference.

BACKGROUND

The inventive concept relates to semiconductor memory devices, and more particularly, to semiconductor memory devices for reducing ripple noise of back-bias voltage, and methods of driving the semiconductor memory devices.

Reduction in leakage current of a semiconductor memory device such as a dynamic random access memory (DRAM) is an important issue. Leakage current generated in a DRAM causes refresh time of a memory cell to be reduced. An example of leakage current is junction leakage current or sub-threshold current. Junction leakage current is generated due to, for example, defects of a junction of a cell transistor, and sub-threshold current is a channel leakage current flowing through a cell transistor.

Junction leakage current can be reduced by reducing ion concentration in a channel. However, by reducing ion concentration in a channel, the sub-threshold current is increased. Sub-threshold current can be reduced by increasing a threshold voltage of a cell transistor. However, by increasing threshold voltage of a cell transistor, the junction leakage current is increased.

In order to simultaneously reduce the junction leakage current and the sub-threshold current, a negative-biased word line structure is used. In a semiconductor memory device including the negative-biased word line structure, a negative voltage is applied to non-selected word lines.

SUMMARY

The inventive concept provides semiconductor memory devices for reducing ripple noise of a back-bias voltage (VBB).

The inventive concept also provides methods of driving the semiconductor memory devices.

The inventive concept also provides memory modules including the semiconductor memory devices.

The inventive concept also provides systems including the semiconductor memory devices.

According to an aspect of the inventive concept, there is provided a semiconductor memory device including a word line driving circuit for enabling a sub-word line connected to a selected memory cell to a first voltage and disabling the sub-word line of a non-selected memory cell to a second voltage and a third voltage, in response to a sub-word line enable signal, a first word line driving signal, and a second word line driving signal; and a delay logic circuit for controlling the semiconductor memory device so that an amount of charge of the sub-word line that is introduced to the third voltage is greater than an amount of charge of the sub-word line that is introduced to the second voltage by changing a transition point of time of the sub-word line enable signal with respect to a transition point of time of the first word line driving signal, during the disabling of the sub-word line.

The first voltage may be a pumping voltage higher than a power voltage, the second voltage may be a ground voltage, and the third voltage may be a negative voltage lower than the ground voltage.

The delay logic circuit may delay the transition point of time of the sub-word line enable signal backwards with respect to the transition point of time of the first word line driving signal, in response to first and second test mode signals.

The delay logic circuit may include a first inverter to which the first test mode signal is input; a first NAND gate to which an output of the first inverter and the first word line driving signal are input; a first delaying unit to which the first test mode signal is input; a second NAND gate to which an output of the first NAND gate and an output of the first delaying unit are input; a second inverter to which the second test mode signal is input; a third NAND gate to which an output of the second inverter and an output of the second NAND gate are input; a second delaying unit to which the second test mode signal is input; a fourth NAND gate to which an output of the third NAND gate and an output of the second delaying unit are input; and a third inverter to which an output of the fourth NAND gate is input and which outputs the sub-word line enable signal.

According to embodiments of the inventive concept, a word line driving circuit may include a PMOS transistor including a source connected a first word line driving signal, a gate connected to a sub-word line enable signal, and a drain connected to a sub-word line; a first NMOS transistor including a source connected to a second voltage, a gate connected to a sub-word line enable signal, and a drain connected to a sub-word line; and a second NMOS transistor including a gate connected to a second word line driving signal, a source connected to a second voltage, and a drain connected to a sub-word line.

The first voltage may be a pumping voltage higher than a power voltage, the second voltage may be a ground voltage, and the third voltage may be a negative voltage lower than the ground voltage.

According to another aspect of the inventive concept, there is provided a semiconductor memory device including a word line driving circuit for enabling a sub-word line connected to a selected memory cell to a first voltage and disabling the sub-word line of a non-selected memory cell to a second voltage and a third voltage, in response to a sub-word line enable signal, a first word line driving signal, and a second word line driving signal; and a delay logic circuit for controlling the semiconductor memory device so that an amount of charge of the sub-word line that is introduced to the second voltage is greater than an amount of charge of the sub-word line that is introduced to the third voltage by changing a transition point of time of the sub-word line enable signal with respect to a transition point of time of the first word line driving signal, during the disabling of the sub-word line.

The first voltage may be a pumping voltage higher than a power voltage, the second voltage may be a ground voltage, and the third voltage may be a negative voltage lower than the ground voltage.

The delay logic circuit may advance the transition point of time of first word line driving signal with respect to the transition point of time of the sub-word line enable signal, in response to first and second test mode signals.

The delay logic circuit may include a first inverter to which the first test mode signal is input; a first NAND gate to which the first test mode signal and an address decoding signal that is formed by decoding a row address signal input to the semiconductor memory device are input; a first delaying unit to which an output of the first inverter and the address decoding signal are input; a second NAND gate to which an output of the first NAND gate and an output of the first delaying unit are input; a second inverter to which the second test mode signal is input; a third NAND gate to which the second test mode signal and an output of the second NAND gate are input; a second delaying unit to which an output of the second inverter and an output of the second NAND gate are input; a fourth NAND gate to which an output of the third NAND gate and an output of the second delaying are input and which outputs the first word line driving signal; and a delaying unit to which the address decoding signal is input and which generates the sub-word line enable signal.

According to another aspect of the inventive concept, there is provided a semiconductor memory device including a plurality of memory cell arrays in which a plurality of memory cells are arranged at intersections between a sub-word line and a bit line; and word line driving blocks each including a word line driving circuit for enabling the sub-word line connected to a selected memory cell to a first voltage and disabling the sub-word line of a non-selected memory cell to a second voltage and a third voltage, wherein a dummy capacitor disposed on an edge side of the memory cell array and the third voltage are connected.

The first voltage may be a pumping voltage higher than a power voltage, the second voltage may be a ground voltage, and the third voltage may be a negative voltage lower than the ground voltage.

According to another aspect of the inventive concept, there is provided a method of driving a semiconductor memory device, the method including driving a sub-word line connected to a selected memory cell to a first voltage to enable the memory cell; and disabling the sub-word line of a non-selected memory cell to a second voltage and a third voltage, wherein the disabling of the sub-word line includes transiting a first word line driving signal so that charge of the sub-word line is discharged to the second voltage; and discharging charge of the sub-word line to the third voltage in response to a sub-word line enable signal, wherein a transition point of time of the sub-word line enable signal is delayed backwards with respect to a transition point of time of the first word line driving signal.

The first voltage may be a pumping voltage higher than a power voltage, the second voltage may be a ground voltage, and the third voltage may be a negative voltage lower than the ground voltage.

According to another aspect of the inventive concept, there is provided a method of driving a semiconductor memory device, the method including driving a sub-word line connected to a selected memory cell to a first voltage to enable the memory cell; and disabling the sub-word line of a non-selected memory cell to a second voltage and a third voltage, wherein the disabling of the sub-word line includes transiting a first word line driving signal so that charge of the sub-word line is discharged to the second voltage; and discharging charge of the sub-word line to the third voltage in response to a sub-word line enable signal, wherein a transition point of time of the first word line driving signal is advanced with respect to a transition point of time of the sub-word line enable signal.

The first voltage may be a pumping voltage higher than a power voltage, the second voltage may be a ground voltage, and the third voltage may be a negative voltage lower than the ground voltage.

According to another aspect of the inventive concept, there is provided a memory module including a printed circuit board (PCB) and at least one memory chip including a semiconductor memory device installed on the PCB. The semiconductor memory device includes a word line driving circuit for enabling a sub-word line connected to a selected memory cell to a pumping voltage and disabling the sub-word line of a non-selected memory cell to a ground voltage and a negative voltage, in response to a sub-word line enable signal, a first word line driving signal, and a second word line driving signal; and a delay logic circuit for controlling the semiconductor memory device so that an amount of charge of the sub-word line that is introduced to the third voltage is greater than an amount of charge of the sub-word line that is introduced to the second voltage by changing a transition point of time of the sub-word line enable signal with respect to a transition point of time of the first word line driving signal, during the disabling of the sub-word line.

According to another aspect of the inventive concept, there is provided a memory module including a printed circuit board (PCB) and at least one memory chip including a semiconductor memory device installed on the PCB. The semiconductor memory device includes a word line driving circuit for enabling a sub-word line connected to a selected memory cell to a pumping voltage and disabling the sub-word line of a non-selected memory cell to a ground voltage and a negative voltage, in response to a sub-word line enable signal, a first word line driving signal, and a second word line driving signal; and a delay logic circuit for controlling the semiconductor memory device so that an amount of charge of the sub-word line that is introduced to the second voltage is greater than an amount of charge of the sub-word line that is introduced to the third voltage by changing a transition point of time of the sub-word line enable signal with respect to a transition point of time of the first word line driving signal, during the disabling of the sub-word line.

According to another aspect of the inventive concept, there is provided a memory module includes a printed circuit board (PCB), and at least one memory chip including a semiconductor memory device installed on the PCB. The semiconductor memory device includes a plurality of memory cell arrays in which a plurality of memory cells are arranged at intersections between a sub-word line and a bit line; and word line driving blocks each including a word line driving circuit for enabling the sub-word line connected to a selected memory cell to a first voltage and disabling the sub-word line of a non-selected memory cell to a second voltage and a third voltage, wherein a dummy capacitor disposed on an edge side of the memory cell array and the third voltage are connected.

According to another aspect of the inventive concept, there is provided a system including a semiconductor memory device and a controller for controlling the semiconductor memory device through a bus. The semiconductor memory device includes a word line driving circuit for enabling a sub-word line connected to a selected memory cell to a pumping voltage and disabling the sub-word line of a non-selected memory cell to a ground voltage and a negative voltage, in response to a sub-word line enable signal, a first word line driving signal, and a second word line driving signal; and a delay logic circuit for controlling the semiconductor memory device so that an amount of charge of the sub-word line that is introduced to the third voltage is greater than an amount of charge of the sub-word line that is introduced to the second voltage by changing a transition point of time of the sub-word line enable signal with respect to a transition point of time of the first word line driving signal, during the disabling of the sub-word line.

According to another aspect of the inventive concept, there is provided a system including a semiconductor memory device and a controller for controlling the semiconductor memory device through a bus. The semiconductor memory device includes a word line driving circuit for enabling a sub-word line connected to a selected memory cell to a pumping voltage and disabling the sub-word line of a non-selected memory cell to a ground voltage and a negative voltage, in response to a sub-word line enable signal, a first word line driving signal, and a second word line driving signal; and a delay logic circuit for controlling the semiconductor memory device so that an amount of charge of the sub-word line that is introduced to the second voltage is greater than an amount of charge of the sub-word line that is introduced to the third voltage by changing a transition point of time of the sub-word line enable signal with respect to a transition point of time of the first word line driving signal, during the disabling of the sub-word line.

According to another aspect of the inventive concept, there is provided a system including a semiconductor memory device and a controller for controlling the semiconductor memory device through a bus. The semiconductor memory device includes a plurality of memory cell arrays in which a plurality of memory cells are arranged at intersections between a sub-word line and a bit line; and word line driving blocks each including a word line driving circuit for enabling the sub-word line connected to a selected memory cell to a first voltage and disabling the sub-word line of a non-selected memory cell to a second voltage and a third voltage, wherein a dummy capacitor disposed on an edge side of the memory cell array and the third voltage are connected.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
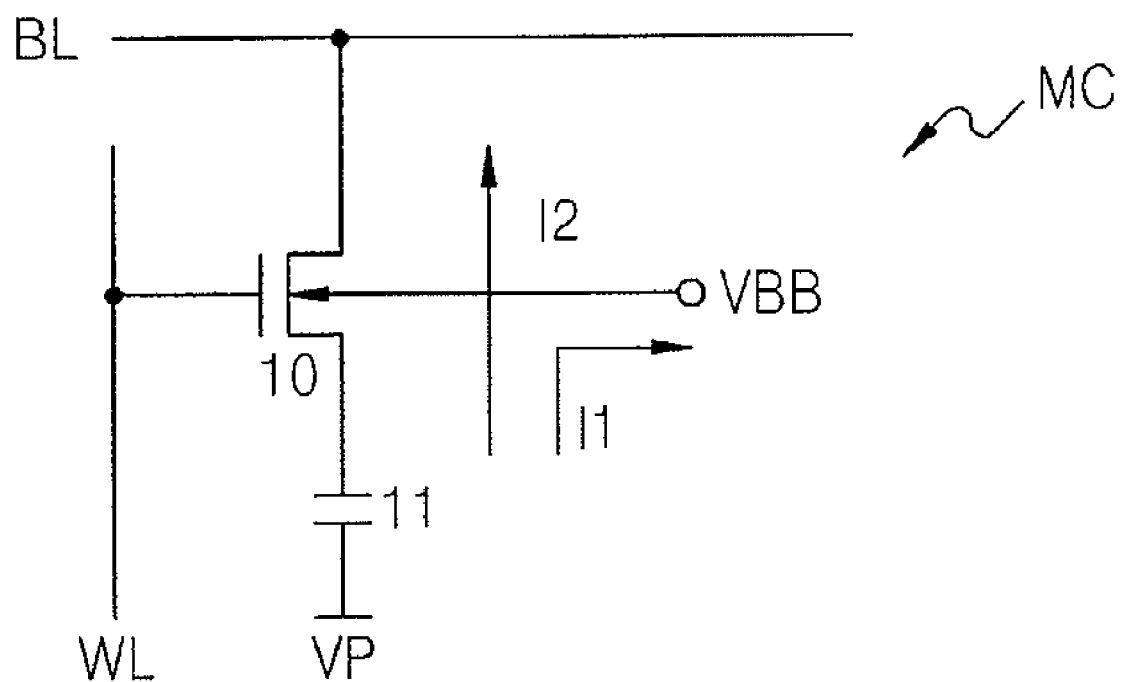
FIG. 1 is a circuit diagram of a typical memory cell of a dynamic random access memory (DRAM).

Hereinafter, the inventive concept will be described in detail by describing exemplary embodiments of the inventive concept with reference to the attached drawings. Like reference numerals in the drawings denote like elements.

FIG. 1 is a circuit diagram of a typical memory cell MC of a dynamic random access memory (DRAM). Referring to FIG. 1, the memory cell MC includes a cell transistor 10 and a cell capacitor 11 that are connected to a sub-word line WL and a bit line BL. A junction leakage current 11 is generated due to defects of a junction of the cell transistor 10. A sub-threshold current 12 is generated due to a channel leakage flowing through the cell transistor 10. In order to reduce the junction leakage current 11 and the sub-threshold current 12, the sub-word line WL is negative-biased. Typically, a negative voltage, that is, a negative back-bias voltage VBB of about −0.3 to about −0.4 V is applied to non-selected word lines WL.

Figure 2:
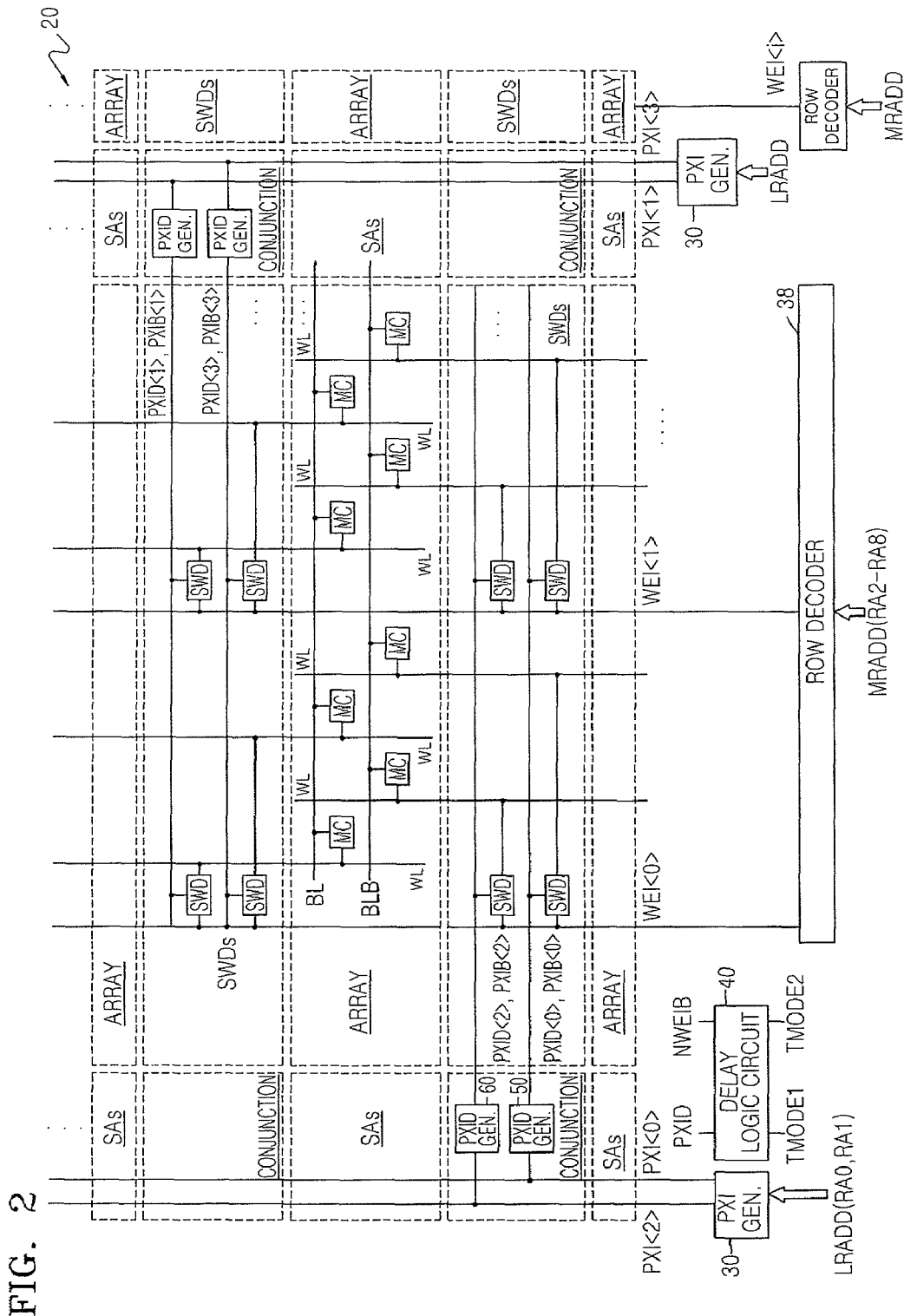
FIG. 2 is a diagram of a semiconductor memory device according to an embodiment of the inventive concept.

FIG. 2 is a diagram of a semiconductor memory device 20 according to an embodiment of the inventive concept. Referring to FIG. 2, the semiconductor memory device 20 includes memory cell arrays ARRAYs, sense amplifier blocks SAs, word driver blocks SWDs, conjunction regions CONJUNCTION, a row decoder 38, a lower decoding signal generating circuit 30, and a delay logic circuit 40.

On each memory cell array ARRAY, memory cells MCs, each of which is the typical memory cell MC of FIG. 1, are arranged at intersections between sub-word lines WLs and bit lines BLs/BLBs.

Word line drivers SWDs for driving the sub-word lines WLs are disposed on the word driver blocks SWDs. Each word line driver SWD is controlled by a word line enable signal WEI output from the row decoder 38, and first and second word line driving signals PXID and PXIB.

The row decoder 38 generates word line enable signals WEI<i> in response to upper row address signals MRADD (RA2 through RA8 in the present embodiment). The row decoder 38 receives and decodes the upper row address signals MRADD, and activates a single word line enable signal WEI. The activated word line enable signal WEI has a pumping voltage VPP level.

The lower decoding signal generating circuit 30 receives and decodes lower row address signals LRADD (RA0 and RA1 in the present embodiment) to generate four lower decoding signals PXI<j> (j is from 0 to 3, in the present embodiment). The lower decoding signals PXI<j> are arranged throughout the semiconductor memory device 20. The lower decoding signals PXI<j> drive word line driving signal generating circuits 50 and 60 of the conjunction region CONJUNCTION.

On the conjunction region CONJUNCTION, the word line driving signal generating circuits 50 and 60 for applying the pumping voltage VPP to the selected sub-word line WL and applying a negative back-bias voltage VBB to the non-selected sub-word line WL are arranged. The word line driving signal generating circuits 50 and 60 generate first and second word line driving signals PXID<j> and PXIB<j> (j is from 0 to 3, in the present embodiment), which are complementary signals for driving the word line drivers SWDs.

When the memory cell MC is accessed, a corresponding word line enable signal WEI and word line driving signals PXID<j> and PXIB<j> are activated. The corresponding word line enable signal WEI drives the corresponding sub-word line WL to the pumping voltage VPP. When the access of the memory cell MC is completed, the word line driver SWD pre-charges the sub-word lines WLs to the negative back-bias voltage (VBB) through a ground voltage VSS.

Figure 3:
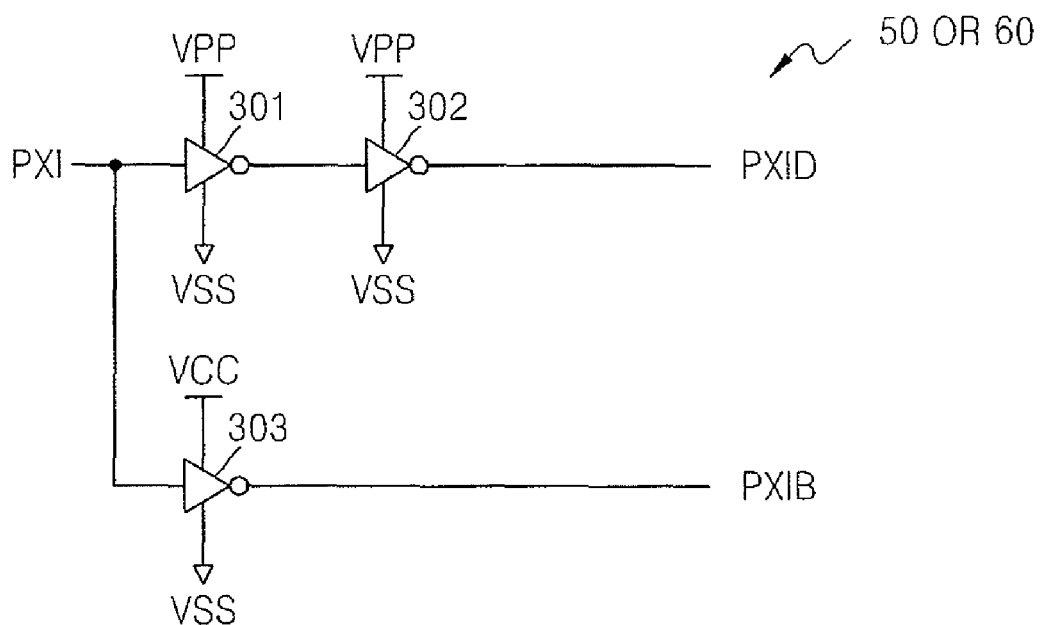
FIG. 3 is a circuit diagram of a word line driving signal generating circuit of FIG. 2.

FIG. 3 is a circuit diagram of the word line driving signal generating circuit 50 or 60 of FIG. 2, according to one embodiment. Referring to FIG. 3, the word line driving signal generating circuit 50 or 60 includes first and second inverters 301 and 302, and a third inverter 303, which are connected parallel to each other and to which a lower decoding signal PXI is input. The first and second inverters 301 and 302 are driven by the pumping voltage VPP and the ground voltage VSS, and the third inverter 303 is driven by a power voltage VCC and the ground voltage VSS. A first word line driving signal PXID output from the second inverter 302 has a pumping voltage VPP level or a ground voltage VSS level, and a second word line driving signal PXIB output from the third inverter 303 has a power voltage VCC level or the ground voltage VSS level. The pumping voltage VPP has a higher voltage level than that of the power voltage VCC.

When a lower decoding signal PXI is transited from a logic low level to a logic high level, the first word line driving signal PXID has the pumping voltage VPP level, and the second word line driving signal PXIB has the ground voltage VSS level. When the lower decoding signal PXI is transited from a logic high level to a logic low level, the first word line driving signal PXID has the ground voltage VSS level, and the second word line driving signal PXIB has the power voltage VCC level. The first and second word line driving signals PXID and PXIB are provided to the word line driver SWD of FIG. 2.

Figure 4:
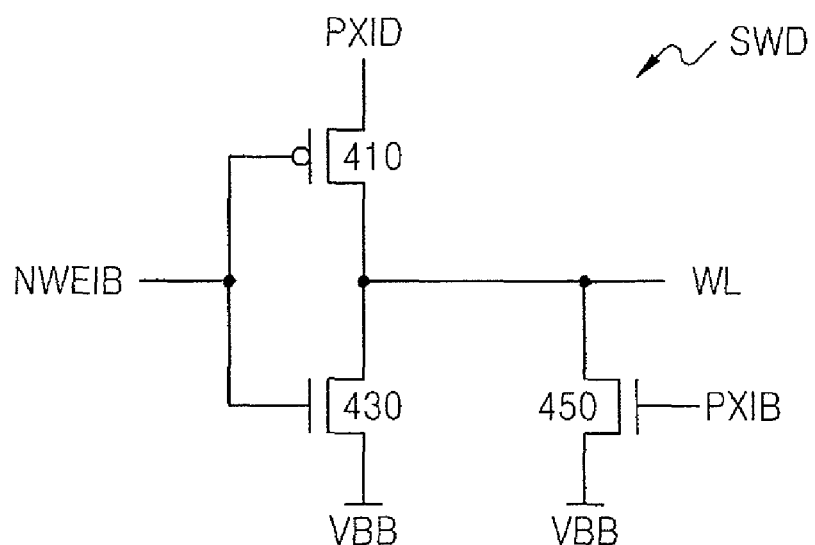
FIG. 4 is a circuit diagram of a word line driver of FIG. 2.

FIG. 4 is a circuit diagram of the word line driver SWD of FIG. 2, according to one embodiment. Referring to FIG. 4, the word line driver SWD includes a PMOS transistor 410 having a source connected to the first word line driving signal PXID, a gate connected to a sub-word line enable signal NWEIB, and a drain connected to the sub-word line WL; a first NMOS transistor 430 having a source connected to a negative back-bias voltage VBB, a gate connected to the sub-word line enable signal NWEIB, and a drain connected to the sub-word line WL; and a second NMOS transistor 450 having a gate connected to the second word line driving signal PXIB, a source connected to the negative back-bias voltage VBB, and a drain connected to the sub-word line WL.

The sub-word line enable signal NWEIB is generated as the ground voltage VSS level, in response to a word line enable signal WEI that is activated as the pumping voltage VPP level. The sub-word line WL has the pumping voltage VPP level in response to the sub-word line enable signal NWEIB of the ground voltage VSS level and the first word line driving signal PXID of the pumping voltage VPP level. During the pre-charge, the sub-word line WL has a negative back-bias voltage VBB level in response to the sub-word line enable signal NWEIB and the second word line driving signal PXIB of the pumping voltage VPP level.

Data stored in the memory cell MC may be lost due to the leakage currents I1 and I2 of the memory cell MC of FIG. 1. Thus, a semiconductor memory device such as a DRAM needs to periodically detect and amplify the data stored in the memory cell MC and then perform a refresh operation of restoring the data in the memory cell MC.

The refresh operation of the DRAM includes a row active operation and a row pre-charge operation. The row active operation includes activating the sub-word line WL that is selected by a row address when a row active signal is enabled, transmitting the data stored in the memory cell MC to the bit line BL, detecting and amplifying the data by a sense amplifier SA, and restoring the data in the memory cell MC. The row pre-charge operation includes disabling the sub-word line WL selected by a row pre-charge command, and maintaining the data restored in the memory cell MC for a predetermined period of time. In a DRAM, a period in which a row active signal is activated to perform the row active operation is defined as tRAS, and a period in which the row pre-charge operation is performed is defined as tRP.

The period tRAS needs to be longer than a minimum required period of time tRAS(min). That is, a period of time is required for activating the row active signal by the row active command and restoring the data refreshed by inputting the upper and lower row addresses MRADD and LRADD in the memory cell MC. When tRAS is shorter than tRAS(min), the data that is detected and amplified by the sense amplifier SA is not appropriately transmitted to the memory cell MC. Thus, in a subsequent operation, even if the data stored in the memory cell MC is transmitted to the bit line BL, a bit line voltage difference ΔVBL having a sufficient width may not be obtained. Accordingly, the properties of the DRAM may be degraded, and a period of time of maintaining of the data stored in the memory cell MC may be reduced, thereby causing errors.

The period tRP is a period of time for disabling the sub-word line WL and the operation of the sense amplifier SA by a row pre-charge signal and performing a subsequent operation. Also, tRP needs to be longer than the minimum required time tRP(min). When tRP is shorter than tRP(min), the bit line BL may not have completely the same level. When the data stored in the memory cell MC is transmitted to a bit line pair BL and /BL that have not completely the same level, inaccurate data is stored in the memory cell MC, thereby causing DRAM errors.

Figure 5:
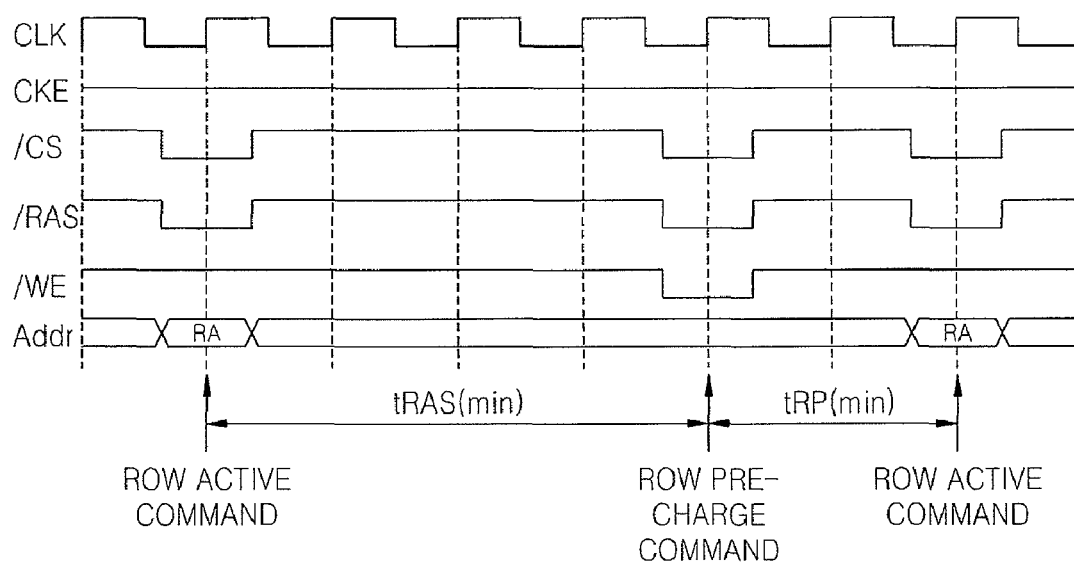
FIG. 5 is a timing diagram of signals tRAS and tRP, according to an embodiment of the inventive concept.

FIG. 5 is a timing diagram illustrating the signals tRAS and tRP, according to an embodiment of the inventive concept. Referring to FIG. 5, tRAS for enabling a row address strobe signal /RAS and then inputting the row pre-charge command needs to be longer than tRAS(min). In addition, tRP for inputting the row pre-charge command and then inputting the row active command needs to also be longer than tRP(min). However, when tRAS(min) and tRP(min) satisfy these conditions, the row active command or the row pre-charge command may always be input. That is, tRAS and tRP may be short.

Figure 6:
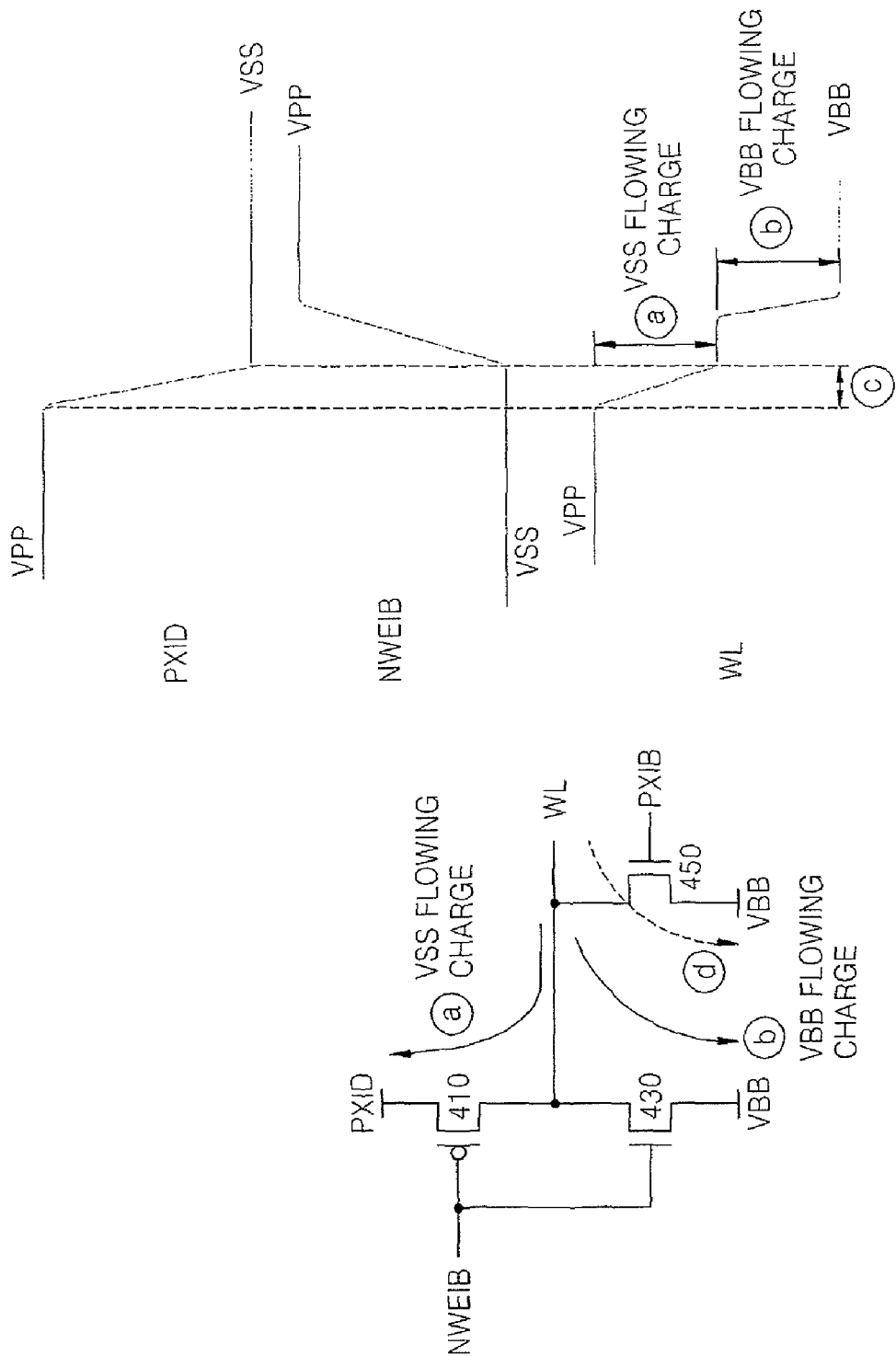
FIG. 6 is a diagram of a current path of the word line driver of FIG. 4.

As shown in FIG. 6, in order to ensure a timing margin of tRP, in an operation of the word line driver SWD, timing ⓒ between the first word line driving signal PXID and the sub-word line enable signal NWEIB, for disabling the sub-word line WL, is set as short as possible. Charge of the sub-word line WL of the pumping voltage VPP level is introduced to the ground voltage VSS through a current path ⓐ connected to the PMOS transistor 410 according to the transition from a logic high level of the pumping voltage VPP level of the first word line driving signal PXID to a logic low level of the ground voltage VSS level, and is introduced to the negative back-bias voltage VBB through a current path ⓑ connected to the first NMOS transistor 430 according to the transition from a logic low level of the ground voltage VSS level of the sub-word line enable signal NWEIB to a logic high level of the pumping voltage VPP level. The charge of the sub-word line WL that is introduced to the negative back-bias voltage VBB is discharged through a current path ⓓ connected to the second NMOS transistor 450 that responds to the second word line driving signal PXIB that is transited from a logic low level of the ground voltage VSS level to a logic high level of the power voltage VCC level, prior to the current path ⓑ.

The refresh operation of the DRAM includes a refresh cycle reduction mode (hereinafter, referred to as "RCR mode"). The RCR mode is an operation mode for reducing a refresh time by doubling or quadrupling the number of enabled sub-word lines WLs, and is used to reduce a period of time for a test. Also in the RCR mode, when the number of enabled word lines is increased, as charge that is introduced to the negative back-bias voltage VBB for disabling the enabled word lines is increased, ripple noise occurs in a negative back-bias voltage VBB level. Noise of the negative back-bias voltage VBB causes the sub-threshold current 12 of the memory cell MC of FIG. 1 to degrade the refresh properties of the DRAM.

In order to reduce the charge introduced to the negative back-bias voltage VBB, the delay logic circuit 40 for controlling as much as possible the amount of charge of the sub-word line WL that is to be introduced to the ground voltage VSS through a current path ⓐ is used in the semiconductor memory device 20 of FIG. 2.

Figure 7:
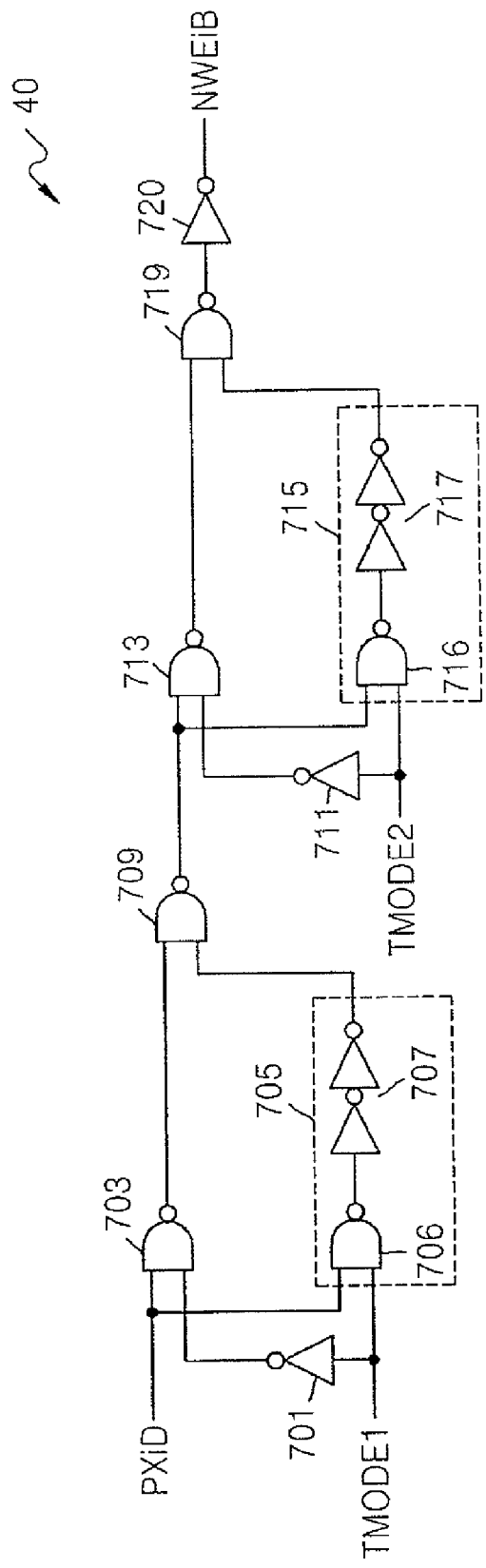
FIGS. 7 and 8 are a circuit diagram and an operational timing diagram, respectively, illustrating a delay logic circuit, according to an embodiment of the inventive concept.

FIGS. 7 through 10 are circuit diagrams and operational timing diagrams illustrating the delay logic circuit 40, according to embodiments of the inventive concept. FIG. 7 is a circuit diagram of the delay logic circuit 40, according to an embodiment of the inventive concept. Referring to FIG. 7, the delay logic circuit 40 is driven by the pumping voltage VPP and the ground voltage VSS. The delay logic circuit 40 includes a first inverter 701 to which a first test mode signal TMODE 1 is input, a first NAND gate 703 to which the output of the first inverter 701 and the first word line driving signal PXID are input, a first delay unit 705 to which the first test mode signal TMODE 1 and the first word line driving signal PXID are input, a second NAND gate 709 to which the output of the first NAND gate 703 and the output of the first delay unit 705 are input, a second inverter 711 to which a second test mode signal TMODE2 is input, a third NAND gate 713 to which the output of the second inverter 711 and the output of the second NAND gate 709 are input, a second delay unit 715 to which the second test mode signal TMODE2 and the output of the second NAND gate 709 are input, a fourth NAND gate 719 to which the output of the third NAND gate 713 and the output of the second delay unit 715 are input, and a third inverter 720 to which the output of the fourth NAND gate 719 is input and which outputs the sub-word line enable signal NWEIB. The first delay unit 705 includes a NAND gate 706 to which the first test mode signal TMODE 1 and the first word line driving signal PXID are input, and a delay chain 707 including a pair of inverters. The second delay unit 715 includes a NAND gate 716 to which the output of the second NAND gate 709 and the second test mode signal TMODE2 are input, and a delay chain 717 including a pair of inverters.

Figure 8:
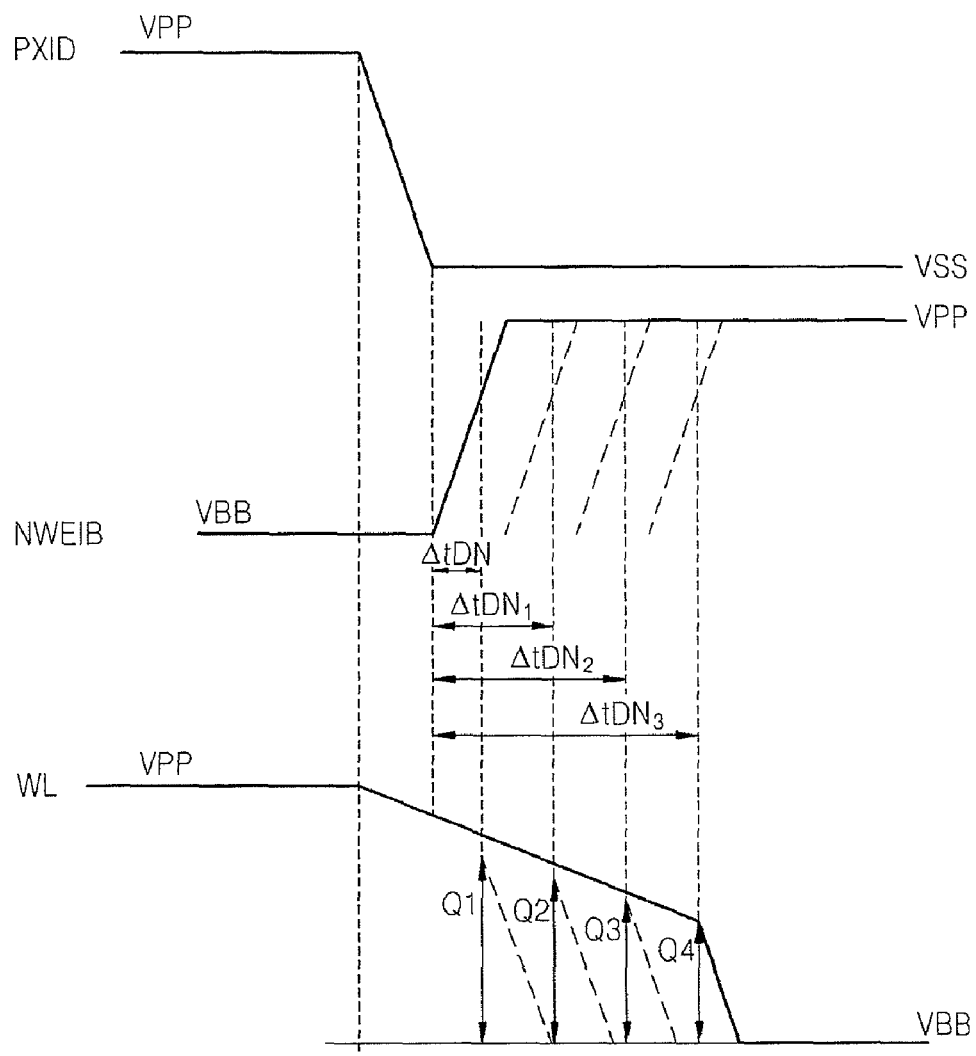

An operation of the delay logic circuit 40 of FIG. 7 will now be described with reference to the timing diagram of FIG. 8. In a normal mode, the first and second test mode signals TMODE1 and TMODE2 are inactivated to a logic low level, and the sub-word line enable signal NWEIB of the pumping voltage VPP level is generated after a default delay time $\Delta tDN$ elapses, wherein the default delay time $\Delta tDN$ is taken for these signals to pass through the first through fourth NAND gates 703, 709, 713 and 719, and the third inverter 720 in response to the first word line driving signal PXID that is transited from a logic high level of the pumping voltage VPP level to a logic low level of the ground voltage VSS level.

In a first delay mode, the first test mode signal TMODE 1 is activated to a logic high level, the second test mode signal TMODE2 is inactivated to a logic low level, and the sub-word line enable signal NWEIB of the pumping voltage VPP level is generated after a first delay time $\Delta tDN_1$ elapses, wherein the first delay time $\Delta tDN_1$ is taken for these signals to pass through the first delay unit 705, the second through fourth NAND gates 709, 713 and 719, and the third inverter 720 in response to the first word line driving signal PXID that is transited to a logic low level.

In a second delay mode, the first test mode signal TMODE 1 is inactivated to a logic low level, the second test mode signal TMODE2 is activated to a logic high level, and the sub-word line enable signal NWEIB of the pumping voltage VPP level is generated after a second delay time $\Delta tDN_2$ elapses, wherein the second delay time $\Delta tDN_2$ is taken for these signals to pass through the first and second NAND gates 703 and 709, the second delay unit 715, the fourth NAND gate 719, and the third inverter 720 in response to the first word line driving signal PXID that is transited to a logic low level.

In a third delay mode, the first and second test mode signals TMODE1 and TMODE2 are activated to a logic high level, and the sub-word line enable signal NWEIB of the pumping voltage VPP level is generated after a third delay time $\Delta tDN_3$ elapses, wherein the third delay time $\Delta tDN_3$ is taken for these signals to pass through the first delay unit 705, the second NAND gate 709, the second delay unit 715, the fourth NAND gate 719, and the third inverter 720 in response to the first word line driving signal PXID that is transited to a logic low level.

A voltage level of the sub-word line WL is lowered to a negative back-bias voltage VBB level as a transition point of time of the sub-word line enable signal NWEIB that is transited to the pumping voltage VPP level with respect to the first word line driving signal PXID that is transited to a logic low level is changed backwards, and accordingly the charge of the sub-word line WL is discharged to the negative back-bias voltage VBB. That is, in a normal mode, charge corresponding to Q1 is discharged to the negative back-bias voltage VBB. In the first delay mode, charge corresponding to Q2 is discharged to the negative back-bias voltage VBB. In the second delay mode, charge corresponding to Q3 is discharged to the negative back-bias voltage VBB. In the third delay mode, charge corresponding to Q4 is discharged to the negative back-bias voltage VBB. From a normal mode towards the first, second, and third delay modes, charge of the sub-word line WL that is discharged to the negative back-bias voltage VBB is gradually reduced. With respect to the word line driver SWD of FIG. 6, towards the first, second, and third delay modes, an amount of charge of the sub-word line WL that is introduced to the ground voltage VSS through a current path ⓐ is gradually increased, and an amount of charge of the sub-word line WL that is introduced to the negative back-bias voltage VBB through a current path ⓑ is gradually reduced. As the charge introduced to the negative back-bias voltage VBB is reduced, ripple noise of the negative back-bias voltage VBB level is prevented.

Figure 9:
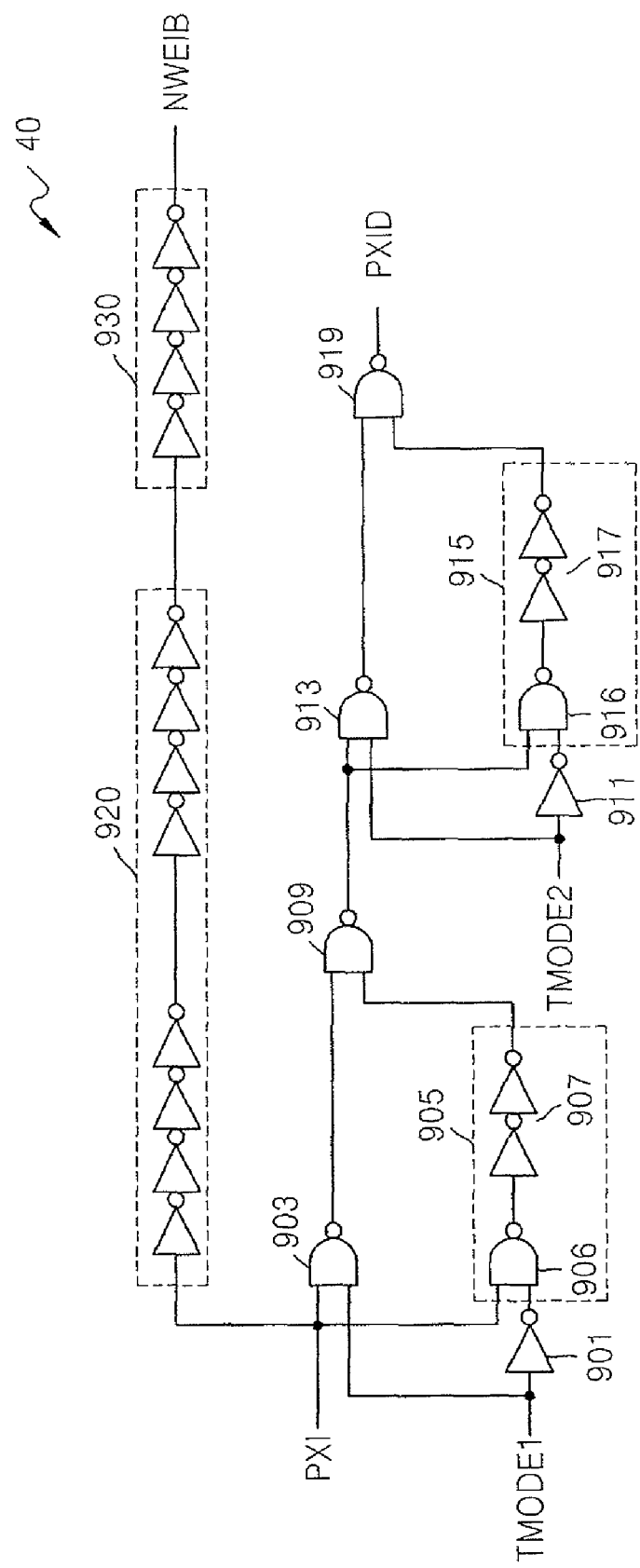
FIGS. 9 and 10 are a circuit diagram and an operational timing diagram, respectively, illustrating a delay logic circuit, according to another embodiment of the inventive concept.

FIG. 9 is a circuit diagram of a delay logic circuit 40, according to another embodiment of the inventive concept. Referring to FIG. 9, the delay logic circuit 40 is driven by the pumping voltage VPP and the ground voltage VSS. The delay logic circuit 40 includes a first inverter 901 to which the first test mode signal TMODE 1 is input, a first NAND gate 903 to which the first test mode signal TMODE 1 and a lower decoding signal PXI are input, a first delay unit 905 to which the output of the first inverter 901 and the lower decoding signal PXI are input, a second NAND gate 909 to which the output of the first NAND gate 903 and the output of the first delaying unit 905 are input, a second inverter 911 to which the second test mode signal TMODE2 is input, a third NAND gate 913 to which the second test mode signal TMODE2 and the output of the second NAND gate 909 are input, a second delaying unit 915 to which the output of the second inverter 911 and the output of the second NAND gate 909 are input, a fourth NAND gate 919 to which the output of the third NAND gate 913 and the output of the second delaying unit 915 are input and which outputs the first word line driving signal PXID, and third and fourth delaying units 920 and 930 connected in series to which the lower decoding signal PXI is input and which output the sub-word line enable signal NWEIB.

The first delaying unit 905 includes a NAND gate 906 to which the output of the first inverter 901 and the lower decoding signal PXI are input, and an inverter delay chain 907 to which the output of the NAND gate 906 is input. The second delaying unit 915 includes a NAND gate 916 to which the output of the second NAND gate 909 and the output of the second inverter 911 are input, and an inverter delay chain 917 to which the output of the NAND gate 916 is input. The third delaying unit 920 compensates for a delay time taken from the lower decoding signal PXI to the first word line driving signal PXID in the word line driving signal generating circuits 50 and 60 of FIG. 3. The fourth delaying unit 930 compensates for a default delay time from the first word line driving signal PXID to the sub-word line enable signal NWEIB in the delay logic circuit 40 of FIG. 7.

Figure 10:
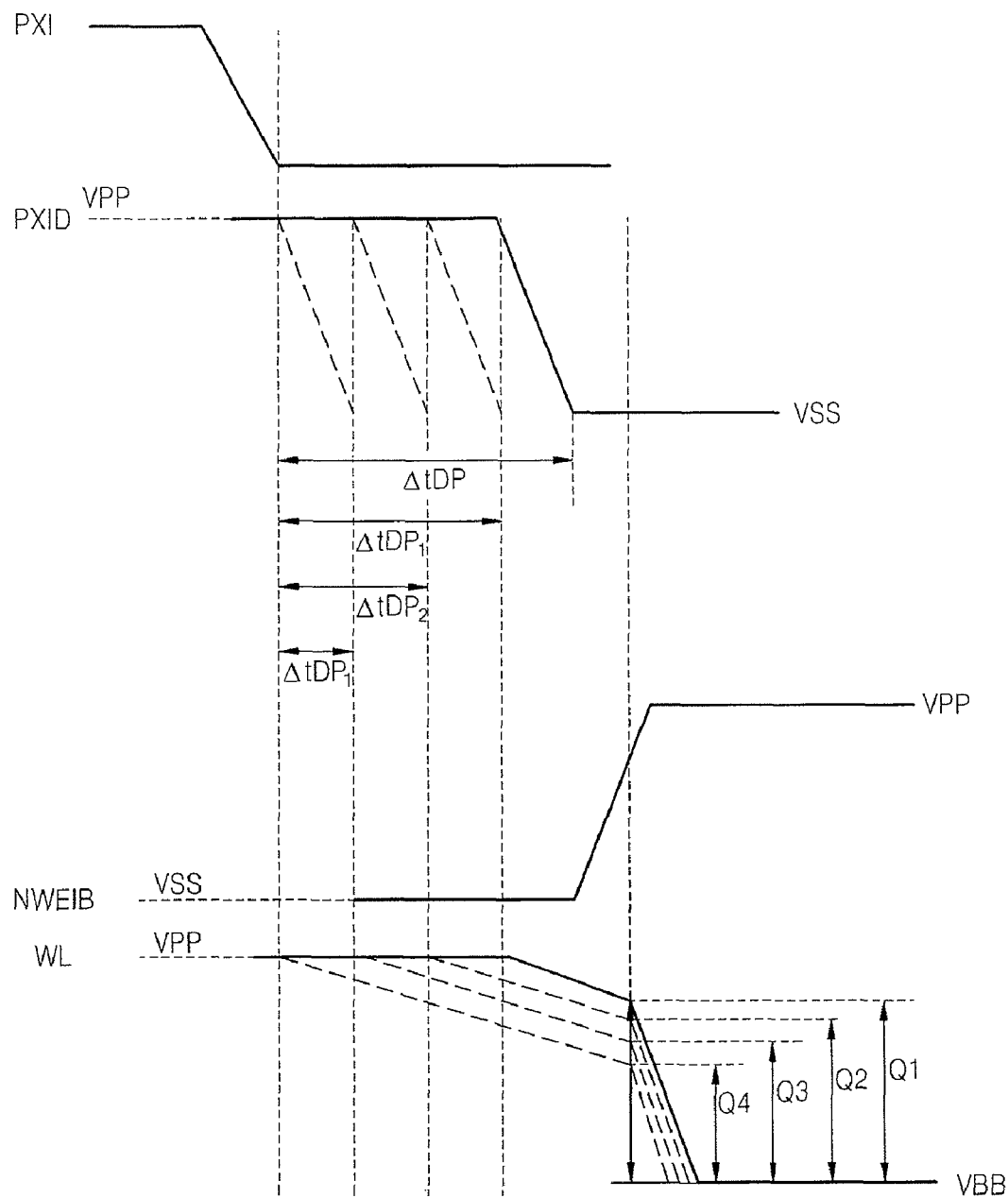

An operation of the delay logic circuit 40 of FIG. 9 will now be described with reference to the timing diagram of FIG. 10. In a normal mode, first and second test mode signals TMODE1 and TMODE2 are inactivated to a logic low level, and the first word line driving signal PXID of the ground voltage VSS level is generated after a default delay time $\Delta tDP$ elapses, wherein the default delay time $\Delta tDP$ is taken for these signals to pass through the first delaying unit 905, the second NAND gate 909, the second delaying unit 915, and the fourth NAND gate 919 in response to the lower decoding signal PXI that is transited from a logic high level to a logic low level.

In a first delay mode, the first test mode signal TMODE 1 is activated to a logic high level, the second test mode signal TMODE2 is inactivated to a logic low level, and the first word line driving signal PXID of the ground voltage VSS level is generated after a first delay time $\Delta tDP_1$ elapses, wherein the first delay time $\Delta tDP_1$ is taken for these signals to pass through the first and second NAND gates 903 and 909, the second delaying unit 915, and the fourth NAND gate 919 in response to the lower decoding signal PXI that is transited to a logic low level.

In a second delay mode, the first test mode signal TMODE 1 is inactivated to a logic low level, the second test mode signal TMODE2 is activated to a logic high level, and the first word line driving signal PXID of the ground voltage VSS level is generated after a second delay time $\Delta tDP_2$ elapses, wherein the second delay time $\Delta tDP_2$ is taken for these signals to pass through the first delaying unit 905, the second NAND gate 909, and the third and fourth NAND gates 913 and 919 in response to the lower decoding signal PXI that is transited to a logic low level.

In a third delay mode, the first and second test mode signals TMODE1 and TMODE2 are activated to a logic high level, and the first word line driving signal PXID of the ground voltage VSS level is generated after a third delay time A $tDP_3$ elapses, wherein the third delay time $\Delta tDP_3$ is taken to pass through the first through fourth NAND gates 903, 909, 913, and 919 in response to the lower decoding signal PXI that is transited to a logic low level.

A voltage level of the sub-word line WL is lowered to a negative back-bias voltage VBB level as a transition point of time of the first word line driving signal PXID that is transited to a logic low level with respect to the sub-word line enable signal NWEIB that is transited to the pumping voltage VPP level is advanced, and accordingly the charge of the sub-word line WL is discharged to the ground voltage VSS in response to the sub-word line enable signal NWEIB that is transited to the pumping voltage VPP level.

That is, in a normal mode, charge corresponding to Q1 is discharged to the negative back-bias voltage VBB. In the first delay mode, charge corresponding to Q2 is discharged to the negative back-bias voltage VBB. In the second delay mode, charge corresponding to Q3 is discharged to the negative back-bias voltage VBB. In the third mode, charge corresponding to Q4 is discharged to the negative back-bias voltage VBB. From a normal mode towards the first, second, and third delay modes, charge of the sub-word line WL that is discharged to the negative back-bias voltage VBB is gradually reduced. That is, towards the first, second, and third delay modes, an amount of charge of the sub-word line WL that is introduced to the ground voltage VSS through a current path ⓐ of FIG. 6 is gradually increased, and an amount of charge of the sub-word line WL that is introduced to the negative back-bias voltage VBB through a current path □ is gradually reduced. Thus, as the charge introduced to the negative back-bias voltage VBB is reduced, ripple noise of the negative back-bias voltage VBB level is prevented.

Figure 11:
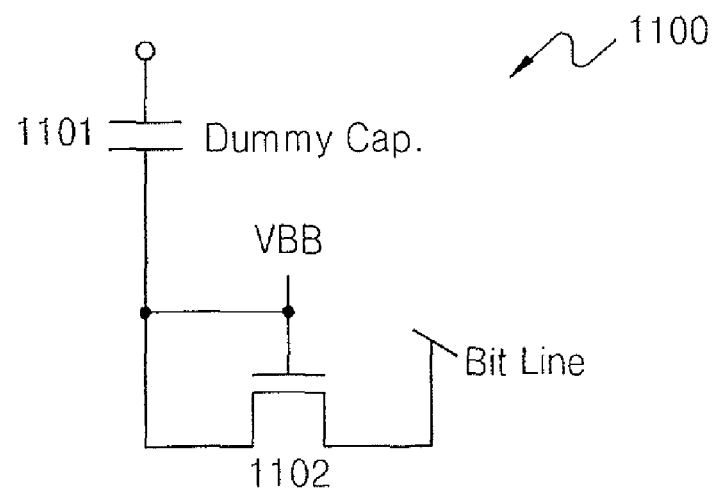
FIGS. 11 through 13 are diagrams of a semiconductor memory device for preventing ripple noise of a back-bias voltage, according to another embodiment of the inventive concept.
Figure 12:
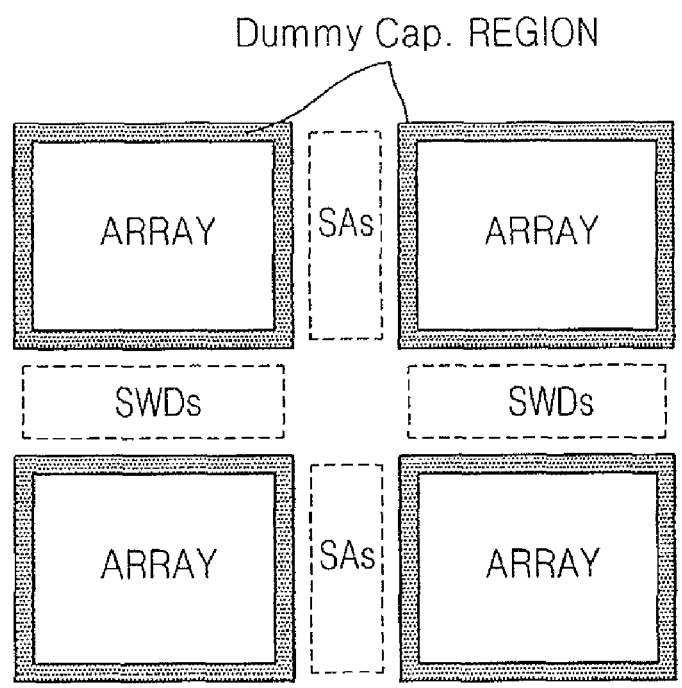
Figure 13:
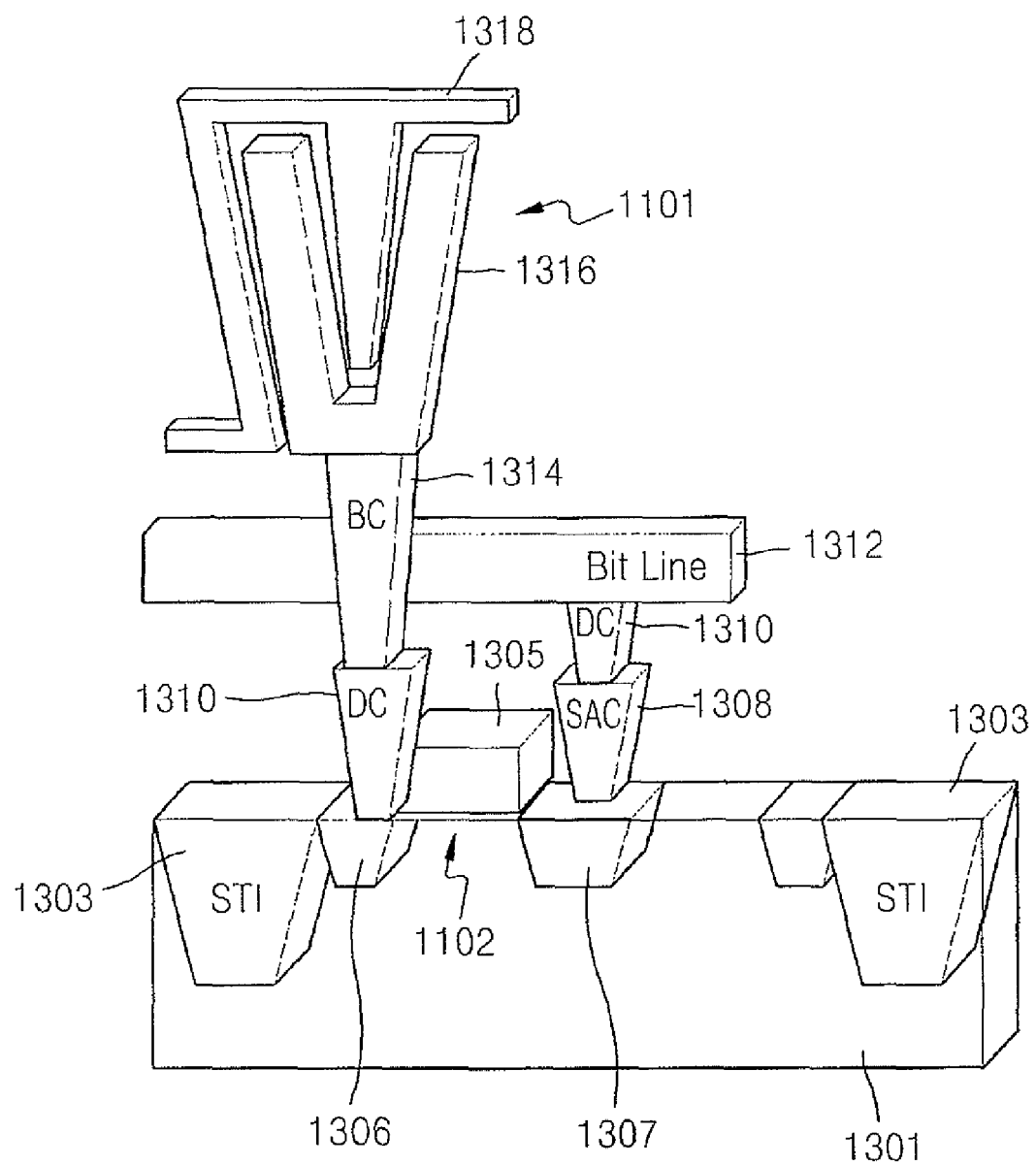

FIGS. 11 through 13 are diagrams of a semiconductor memory device 1100 for preventing ripple noise of a negative back-bias voltage VBB, according to another embodiment of the inventive concept. Referring to FIG. 11, in the semiconductor memory device 1100, a negative back-bias voltage VBB is connected to a first electrode of a dummy capacitor 1101. Dummy capacitors 1101 are disposed on edge sides of memory cell arrays ARRAYs of FIG. 12. The dummy capacitor 1101 is disposed in order to compensate for the step difference between the memory cell array ARRAY region and a peripheral circuit region. In FIG. 11, the negative back-bias voltage VBB is connected to a gate of a transistor 1102 disposed between the dummy capacitor 1101 and the bit line BL. Thus, ripple noise of the negative back-bias voltage VBB level may be prevented by the dummy capacitor 1101 having a significant great capacity, for example, of about sub-micro farad (uF).

FIG. 13 is a schematic perspective and cross-sectional view of a semiconductor memory device manufactured by a semiconductor manufacturing process for realizing a connection structure of negative back-bias voltage VBB, according to an embodiment of the inventive concept. Referring to FIG. 13, device separation films 1303 are formed on a semiconductor substrate 1301 by using a narrow trench device separation process (STI) so as to define an active region where a transistor 1102 is to be formed. A gate 1305 is formed on the active region, and source/drain 1306 and 1307 are formed on both active regions of the gate 1305. After an interlayer insulating layer (not shown) filled in a space around the gate 1305 is planarized, a self aligned contact (SAC) pad 1308 is formed so as to contact the drain 1307. A direct contact pad 1310 that contacts the source 1306, and a direct contact pad 1310 connected to the SAC pad 1308 are formed. The direct contact pad 1310 that contacts the source 1306 is formed so as to contact the gate 1305. A bit line 1312 is formed as a metal layer so as to be connected to the direct contact pad 1310 that contacts the SAC pad 1308, and the direct contact pad 1310 that contacts the source 1306, and an embedded contact plug 1314 are formed. A lower electrode 1316 of the dummy capacitor 1101 connected to the embedded contact plug 1314 is formed, and an upper electrode 1318 is formed on the lower electrode 1316, wherein a dielectric layer (not shown) is disposed between the lower electrode 1316 and the upper electrode 1318. The dummy capacitor 1101 is formed as a cylinder-type capacitor.

Figure 14:
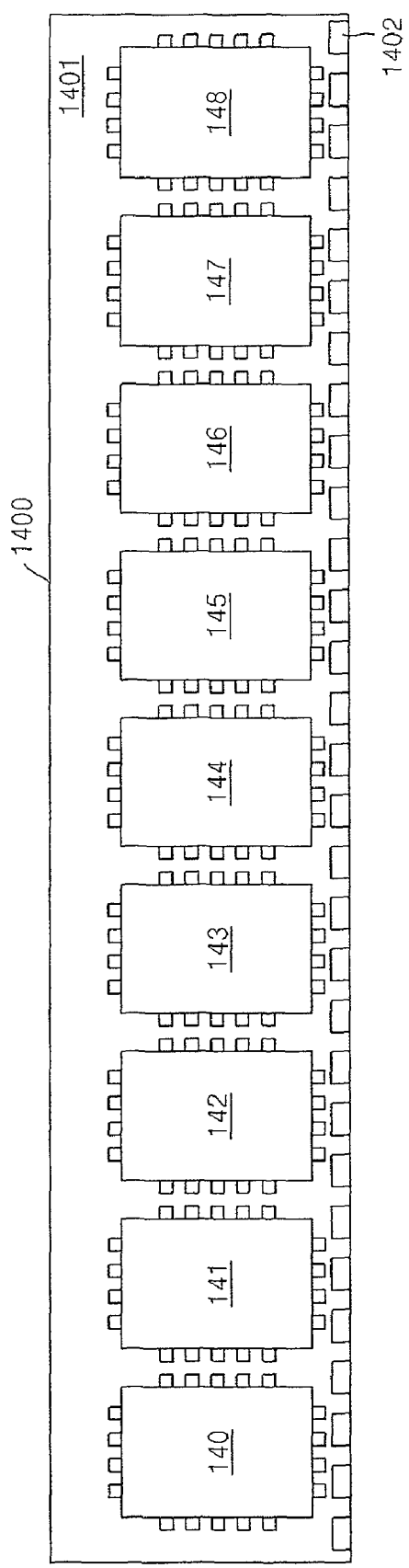
FIG. 14 is a diagram of a memory module including memory chips including semiconductor memory devices, according to an embodiment of the inventive concept.

FIG. 14 is a diagram of a memory module 1400 including memory chips 140 through 148 including semiconductor memory devices 20 or 1100, according to an embodiment of the inventive concept. The memory module 1400 of FIG. 14 includes the memory chips 140 through 148 including the semiconductor memory devices 20 or 1100 of FIG. 2 or 11. The memory module 1400 is a single in-line memory module including nine memory chips 140 through 148 that are disposed on a single surface of a printed circuit board (PCB) 1401. Typically, the number of memory chips in a SIMM may be from 3 to 9. The PCB 1401 includes edge connectors 1402 for inserting into a memory socket formed on a computer mother board, along one side longitudinal edge. Although not illustrated, a wiring pattern is formed on the PCB 1401, and terminals or leads constituting the edge connector 1402 are connected to the memory chips 140 through 148.

Figure 15:
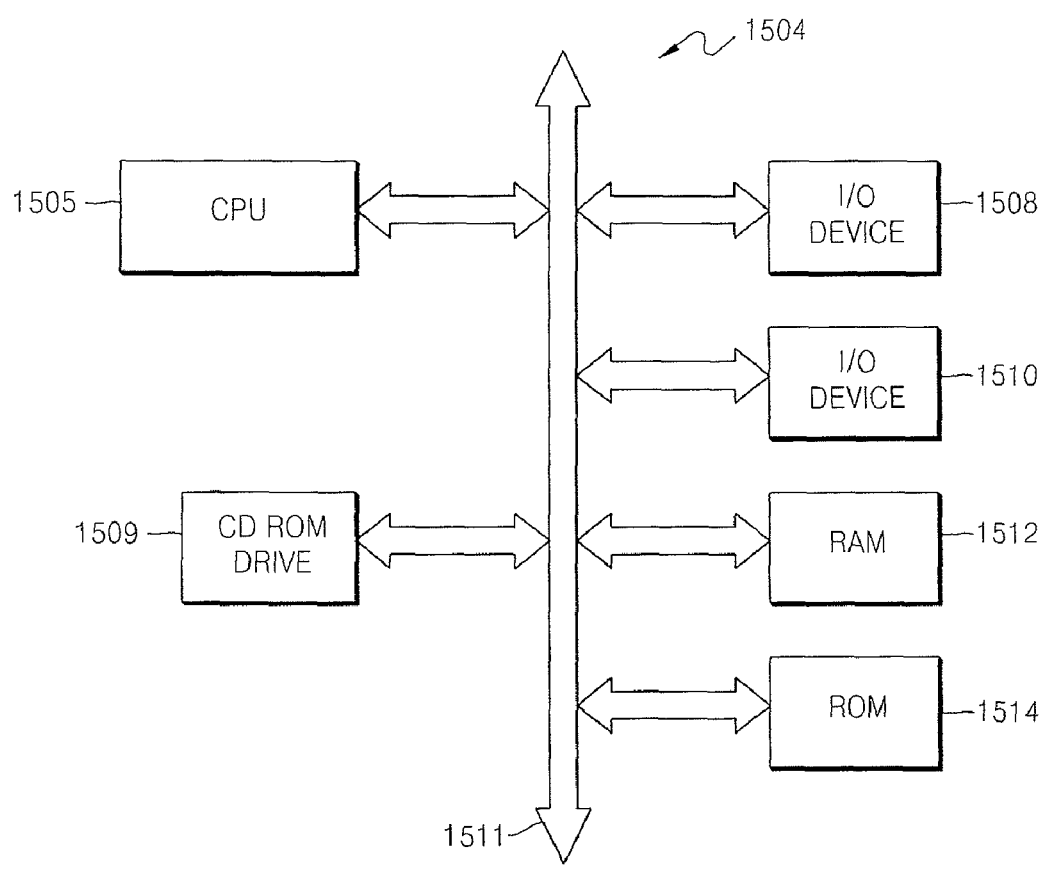
FIG. 15 is a block diagram of a processor-based system using a random access memory (RAM) embodied as a semiconductor memory device, according to an embodiment of the inventive concept.

FIG. 15 is a block diagram of a processor-based system 1504 using a random access memory (RAM) 1512 embodied as a semiconductor memory device, according to an embodiment of the inventive concept. That is, the RAM 1512 prevents ripple noise of the negative back-bias voltage VBB that has been described with reference to FIG. 2 or 11. The processor-based system 1504 may be a computer system, a processor controlling system, or another system including a memory related to a processor. The processor-based system 1504 includes a central processor unit (CPU) 1505, such as a micro processor, that communicates with the RAM 1512 and input/output (I/O) devices 1508 and 1510 via a bus 1511. The processor-based system 1504 includes a read only memory (ROM) 1514, and peripheral devices such as CD ROM drive 1509 that communicates with the CPU 1505 via the bus 1511.

While the inventive concept has been particularly shown and described with reference to exemplary embodiments thereof, it will be understood that various changes in form and details may be made therein without departing from the spirit and scope of the following claims.

What is claimed is:
1. A semiconductor memory device comprising:
a word line driving circuit for enabling a sub-word line connected to a selected memory cell to a first voltage and disabling the sub-word line of a non-selected memory cell to a second voltage and a third voltage, in response to a sub-word line enable signal, a first word line driving signal, and a second word line driving signal; and
a delay logic circuit for controlling the semiconductor memory device so that an amount of charge of the sub-word line that is introduced to the third voltage is greater than an amount of charge of the sub-word line that is introduced to the second voltage by changing a transition point of time of the sub-word line enable signal with respect to a transition point of time of the first word line driving signal, during the disabling of the sub-word line.

2. The semiconductor memory device of claim 1, wherein the first voltage is a pumping voltage higher than a power voltage,
wherein the second voltage is a ground voltage, and
wherein the third voltage is a negative voltage lower than the ground voltage.

3. The semiconductor memory device of claim 1, wherein the delay logic circuit delays the transition point of time of the sub-word line enable signal backwards with respect to the transition point of time of the first word line driving signal, in response to first and second test mode signals.

4. The semiconductor memory device of claim 3, wherein the delay logic circuit comprises:
a first inverter to which the first test mode signal is input;
a first NAND gate to which an output of the first inverter and the first word line driving signal are input;
a first delaying unit to which the first test mode signal is input;
a second NAND gate to which an output of the first NAND gate and an output of the first delaying unit are input;
a second inverter to which the second test mode signal is input;
a third NAND gate to which an output of the second inverter and an output of the second NAND gate are input;
a second delaying unit to which the second test mode signal is input;
a fourth NAND gate to which an output of the third NAND gate and an output of the second delaying unit are input; and
a third inverter to which an output of the fourth NAND gate is input and which outputs the sub-word line enable signal.

5. A semiconductor memory device comprising:
a word line driving circuit for enabling a sub-word line connected to a selected memory cell to a first voltage and disabling the sub-word line of a non-selected memory cell to a second voltage and a third voltage, in response to a sub-word line enable signal, a first word line driving signal, and a second word line driving signal; and
a delay logic circuit for controlling the semiconductor memory device so that an amount of charge of the sub-word line that is introduced to the second voltage is greater than an amount of charge of the sub-word line that is introduced to the third voltage by changing a transition point of time of the sub-word line enable signal with respect to a transition point of time of the first word line driving signal, during the disabling of the sub-word line.

6. The semiconductor memory device of claim 5, wherein the first voltage is a pumping voltage higher than a power voltage,
wherein the second voltage is a ground voltage, and
wherein the third voltage is a negative voltage lower than the ground voltage.

7. The semiconductor memory device of claim 5, wherein the delay logic circuit advances the transition point of time of first word line driving signal with respect to the transition point of time of the sub-word line enable signal, in response to first and second test mode signals.

8. The semiconductor memory device of claim 7, wherein the delay logic circuit comprises:
a first inverter to which the first test mode signal is input;
a first NAND gate to which the first test mode signal and an address decoding signal that is formed by decoding a row address signal input to the semiconductor memory device are input;
a first delaying unit to which an output of the first inverter and the address decoding signal are input;
a second NAND gate to which an output of the first NAND gate and an output of the first delaying unit are input;
a second inverter to which the second test mode signal is input;
a third NAND gate to which the second test mode signal and an output of the second NAND gate are input;
a second delaying unit to which an output of the second inverter and an output of the second NAND gate are input;

a fourth NAND gate to which an output of the third NAND gate and an output of the second delaying unit are input and which outputs the first word line driving signal; and a delaying unit to which the address decoding signal is input and which generates the sub-word line enable signal.

9. A method of driving a semiconductor memory device, the method comprising:

driving a sub-word line connected to a selected memory cell to a first voltage to enable the memory cell; and disabling the sub-word line of a non-selected memory cell to a second voltage and a third voltage, wherein the disabling of the sub-word line comprises:

transiting a first word line driving signal so that charge of the sub-word line is discharged to the second voltage; and discharging charge of the sub-word line to the third voltage in response to a sub-word line enable signal, wherein a transition point of time of the sub-word line enable signal is delayed backwards with respect to a transition point of time of the first word line driving signal.

10. The method of claim 9, wherein the first voltage is a pumping voltage higher than a power voltage, wherein the second voltage is a ground voltage, and wherein the third voltage is a negative voltage lower than the ground voltage.

11. A method of driving a semiconductor memory device, the method comprising:

driving a sub-word line connected to a selected memory cell to a first voltage to enable the memory cell; and disabling the sub-word line of a non-selected memory cell to a second voltage and a third voltage, wherein the disabling of the sub-word line comprises:

transiting a first word line driving signal so that charge of the sub-word line is discharged to the second voltage; and discharging charge of the sub-word line to the third voltage in response to a sub-word line enable signal, wherein a transition point of time of the first word line driving signal is advanced with respect to a transition point of time of the sub-word line enable signal.

12. The method of claim 11, wherein the first voltage is a pumping voltage higher than a power voltage, wherein the second voltage is a ground voltage, and wherein the third voltage is a negative voltage lower than the ground voltage.

* * * * *